United States Patent
Borland et al.

(10) Patent No.: US 7,818,855 B2
(45) Date of Patent: Oct. 26, 2010

(54) METHOD OF MAKING THIN-FILM CAPACITORS ON METAL FOIL USING THICK TOP ELECTRODES

(75) Inventors: William Borland, Chapel Hill, NC (US); Cengiz Ahmet Palanduz, Durham, NC (US); Olga L. Renovales, Apex, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/868,736

(22) Filed: Oct. 8, 2007

(65) Prior Publication Data

US 2008/0112110 A1    May 15, 2008

Related U.S. Application Data

(60) Provisional application No. 60/865,311, filed on Nov. 10, 2006.

(51) Int. Cl.
*H01G 7/00* (2006.01)
(52) U.S. Cl. ............... 29/25.42; 29/25.41; 438/393; 438/394; 438/396; 438/399
(58) Field of Classification Search ......... 29/68, 29/71, 296, 297, 298, 300, 301, 302, 306, 29/307, 308, 312, 313, 535, 25.41, 25.42; 439/393–399
See application file for complete search history.

(56) References Cited

U.S. PATENT DOCUMENTS

| | | | |
|---|---|---|---|
| 5,796,572 A * | 8/1998 | Kawai | 361/313 |
| 6,270,835 B1 * | 8/2001 | Hunt et al. | 427/79 |
| 7,029,971 B2 | 4/2006 | Borland et al. | |
| 7,072,167 B2 | 7/2006 | Borland | |
| 7,100,277 B2 | 10/2007 | Borland et al. | |
| 7,290,315 B2 * | 11/2007 | Palanduz et al. | 29/25.41 |
| 2002/0030218 A1 | 3/2002 | Arita | |
| 2002/0095756 A1 * | 7/2002 | Park et al. | 29/25.42 |
| 2004/0016094 A1 * | 1/2004 | Schaper | 29/25.42 |
| 2004/0108134 A1 * | 6/2004 | Borland et al. | 174/260 |
| 2004/0231885 A1 | 11/2004 | Borland et al. | |
| 2005/0141171 A1 * | 6/2005 | Borland | 361/321.2 |
| 2005/0276002 A1 * | 12/2005 | Sridharan et al. | 361/321.1 |
| 2006/0097246 A1 | 5/2006 | Palanduz et al. | |
| 2007/0138633 A1 | 6/2007 | Amey et al. | |

FOREIGN PATENT DOCUMENTS

| | | |
|---|---|---|
| EP | 1551041 B1 | 3/2007 |
| GB | 2334622 A | 8/1999 |
| JP | 07240342 | 9/1995 |
| JP | 11204374 | 7/1999 |
| KR | 19960007844 | 6/1996 |

OTHER PUBLICATIONS

European Search Report dated Feb. 22, 2008, European Application No. 07 02 0129.

* cited by examiner

*Primary Examiner*—Derris H Banks
*Assistant Examiner*—Jeffrey Carley

(57) ABSTRACT

Methods of making thin film capacitors formed on foil by forming onto a thin film dielectric in a single deposition event an integrally complete top electrode having a minimum thickness of at least 1 micron.

14 Claims, 5 Drawing Sheets

METHOD OF MAKING THIN-FILM CAPACITORS ON METAL FOIL USING THICK TOP ELECTRODES

BACKGROUND OF THE INVENTION

1. Field of the Invention

The present invention pertains to thin film capacitors, more particularly to thin film capacitors formed on metal foil that are embedded into printed wiring boards (PWB) and provide capacitance for decoupling and controlling voltage for integrated circuit die that are mounted on the printed wiring board.

2. Description of Related Art

Semiconductor devices including integrated circuits (IC) are operating at increasingly higher frequencies, higher data rates and lower voltages. This means that noise in the power and ground (return) lines and the need to supply sufficient current to accommodate faster circuit switching require lower impedance in the power distribution system. To lower noise and stabilize power to the IC, impedance in conventional circuits is reduced by the use of additional surface mount technology (SMT) capacitors interconnected in parallel. The use of higher operating frequencies, that is, higher IC switching speeds, demands that voltage response times to the IC be faster. The use of lower operating voltages requires voltage variations (ripple) and noise has to be lower.

For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin and the IC will trigger false gates. Additionally, as the IC powers up, a slow response time will result in power overshoot. Power droop and overshoot must be controlled within allowable limits by the use of capacitors that are close enough to the IC that they provide or absorb power within an appropriate response time.

Conventional designs for printed wiring boards (PWBs) generally place capacitors for decoupling and dampening power droop or overshoot as close to the IC as possible to improve capacitor performance. In these designs, capacitors are surface mounted on the PWB and a large number of them requires complex electrical routing which leads to inductance. As frequencies increase and operating voltages continue to drop, power increases and higher capacitance has to be supplied at increasingly lower inductance levels. A solution would be to incorporate a high capacitance density, thin film ceramic capacitor in the PWB package onto which the IC is mounted. A single layer ceramic capacitor directly under the IC reduces inductance to a minimum and the high capacitance density provides the capacitance to satisfy the IC requirements. Such a high capacitance density capacitor in the PWB can provide current at a significantly quicker response time and lower inductance.

In achieving a high capacitance density capacitor, there are several considerations. One is to choose a thin film capacitor dielectric. Thin film capacitor dielectrics having a thickness of less than 1 micron ($\mu$m) are known.

Another consideration is to choose a capacitor dielectric having a high permittivity or dielectric constant ["Dk"]. Thin film capacitor dielectrics having high dielectric constants are well known, especially in ferroelectric ceramics. Ferroelectric materials with high dielectric constants include perovskites of the general formula $ABO_3$ in which the A site and B site can be occupied by one or more different metals. For example, a high dielectric constant is realized in crystalline barium titanate (BT), lead zirconate titanate (PZT), lead lanthanum zirconate titanate (PLZT), lead magnesium niobate (PMN) and barium strontium titanate (BST) and these materials are commonly used in surface mount component devices. Barium titanate based compositions are particularly useful not only because have high dielectric constants and are lead free.

Deposition of thin films onto a substrate is done by, for example, sputtering, laser ablation, chemical vapor deposition, and chemical solution deposition and initially results in either an amorphous or a partially crystalline film, depending upon deposition conditions. Amorphous compositions have low Dk (approximately 20) and have to be annealed at high temperatures to induce crystallization and the desired high Dk phase. High temperature annealing of barium titanate thin films formed on base metal foils, such as copper or nickel, require low oxygen partial pressures to avoid oxidation of the metal.

The high Dk phase in barium titanate based dielectrics can be achieved only when grain size exceeds approximately 0.1 micron, which means annealing at temperatures as high as 900° C. or higher may be required to develop the appropriate grain size. U.S. Pat. No. 7,029,971 to Borland et al. considers these dielectric compositions and annealing temperatures in developing capacitors with capacitance densities greater than 0.5 micro-Farad per square centimeter ($\mu F/cm^2$).

A further consideration in achieving a high capacitance density capacitor is the manner of formation of the top electrode of the capacitor. Typically, after annealing the dielectric at high temperature, depositing an electrode onto the dielectric by sputtering or other similar techniques can result in thin electrodes smaller than 0.1 micron. However, making thin electrodes typically requires a very long sputtering time and is therefore time consuming and expensive. It also exposes the dielectric to plating solutions that can compromise dielectric reliability. A more economical method for forming the top electrode of the capacitor is needed. Thus, the problem to be solved is to make a usable high capacitance density capacitor formed on foil and having a top electrode between 1 and 30 microns, that is, a thick top electrode. This consideration is not suggested, hinted at nor is a predictable result of U.S. Pat. No. 7,029,971 to Borland et al.

SUMMARY

The methods described herein solve the technical problem by forming a thick top metallic electrode onto a thin-film dielectric on metal foil, such that the electrode supports capacitance densities greater than 0.5 micro-Farad per square centimeter ($\mu F/cm^2$). These methods can be done by screen printing a conductive paste or laminating a conductive tape or casting a conductive slurry onto the thin film dielectric. The conductor composition may be a polymer thick-film conductor composition that can be cured at a temperature between about 120° C. and about 160° C. Alternatively, the thick-film conductor composition may require firing at an elevated temperature, such as between about 500° C. and about 900° C., to sinter the top electrode.

When a conductive tape is used to form the electrode, it comprises metal particles dispersed in a polymer matrix and is applied to the dielectric by lamination. When a slurry is used, it comprises metal particles dispersed in a polymer/solvent and matrix and is coated and dried onto the previously fired dielectric. The tape composition or dried slurry may be fired at an elevated temperature, such as between 600 to 900° C. to sinter the top electrode.

These methods solve the technical problem of how to form a thick capacitor top electrode to achieve a more useful high capacitance density capacitor. Conductor compositions described herein eliminate the need to sputter and plate the electrode up to a suitable thickness. In addition, screen-printing methods provide a directly patterned electrode, which eliminates the need for subsequent processing to create individual electrodes and is thus especially economical.

Capacitors made according to the above methods can be embedded into inner-layer panels, which may in turn be incorporated into printed wiring boards. These capacitors have thick top and bottom electrodes that are compatible with printed wiring board requirements.

BRIEF DESCRIPTION OF THE DRAWINGS

The detailed description will refer to the following drawings, wherein.

DETAILED DESCRIPTION

Definitions

Figure 1:
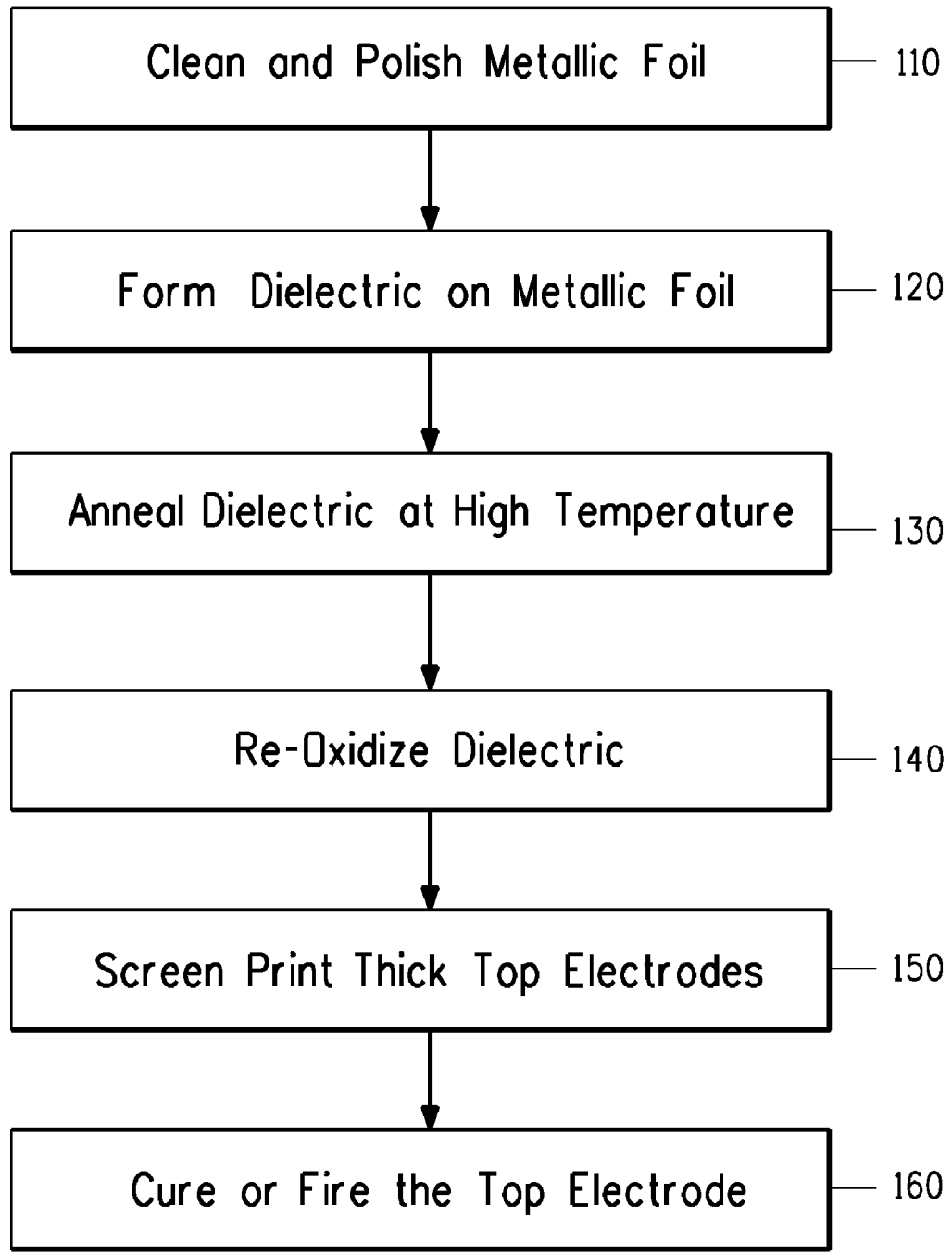
FIG. 1 is a block diagram illustrating a process for making high capacitance density capacitors on metal foil wherein patterned thick-film top electrodes are formed by screen-printing a conductive paste on to a pre-annealed dielectric and firing or curing the thick-film conductor.

The methods described below are discussed in the following terms defined below.

As used herein, the terms "annealing" and "firing" are interchangeable and refer to processing either the dielectric or the top electrode or both at a sufficiently elevated temperature to densify and crystallize the dielectric and/or to sinter the metallic particles of the conductive composition together to form a metallic electrode.

As used herein, the term "thick-film conductor" refers to a printable composition that comprises metallic particles dispersed in a polymer/solvent medium such that, when the composition is fired at a sufficiently elevated temperature, its organic content is driven or burnt off and the metallic particles are sintered together to form a metallic film.

As used herein, the term "polymer thick-film conductor" refers to a printable composition that comprises metallic particles dispersed in a polymer/solvent medium such that heating or curing the composition at a temperature between about 100° C. and about 200° C. hardens the organic content of the composition so that the metallic particles create a conductive film.

As used herein, the term "thick electrode" refers to an electrode 1 to 30 microns in thickness.

As used herein, the term "formed directly" refers to the creation of individual electrodes in their final form without the need for plating or etching.

Described herein are methods of making capacitors with high capacitance densities of greater than 0.5 µF/cm$^2$ having thin film barium titanate based dielectrics and with thick top electrodes. Barium titanate (or $BaTiO_3$) is the base material used in the formation of these dielectrics.

To the $BaTiO_3$ may be added various substitute and dopant cations to modify dielectric properties. For example, (1) transition metal cations with the preferred oxide stoichiometry $MO_2$, where M is the transition metal cation, e.g., Zr, Hf, Sn, Ce, may be added. These smooth the temperature dependence of the permittivity by shifting the three phase transitions of $BaTiO_3$ closer to one another in temperature space. (2) Metal cations with the preferred oxide stoichiometry MO, where M is an alkaline earth metal, e.g., Ca, Sr, Mg, may also be added. MO and $MO_2$ cations shift the dielectric temperature maxima to lower temperatures further smoothing the temperature dependent response. (3) Rare earth cations having the preferred oxide stoichiometry $R_2O_3$ where R is a rare earth cation, e.g., Y, Ho, Dy, La, Eu, may be added to improve the dielectric reliability. (4) Transition metal cations with multiple preferred valence states such as Mn and Fe may be added. These cations are of interest for their ability to improve insulation resistance. Any dopant or dopant mixture are used in these methods in concentrations between 0 and 5 mol percent. Specific dopant combinations will depend on the required balance of dielectric properties, transport properties, and temperature dependent properties.

For all methods described herein, chemical solution deposition ["CSD"] techniques or sputtering may be used to form the dielectric of the high capacitance density capacitors made by these methods. See generally, R. W. Schwartz (1997) *Chemical Solution Deposition of Perovskite Thin Films*, Chem. Mater. 9:2325-2340. CSD techniques are desirable due to their simplicity and low cost. The capacitors formed by these methods have a physically robust dielectric thickness between about 0.2 and 2.0 µm.

FIG. 1 is a block diagram of methods suitable for forming a thick-film electrode on a previously annealed and crystallized dielectric on metal foil. The dielectric of the resultant capacitor may be deposited by a number of techniques, preferably sputtering or CSD.

The deposition process for the top electrode illustrated in FIG. 1 is thick film printing. Other methods of depositing the thick-film paste, such as stencil printing, may be employed. In step 110, at least one side of a metallic foil may optionally but preferably be cleaned and polished. The metallic foil may be made from a base metal, such as copper or nickel. The metal foil is the substrate upon which the capacitor is built and acts as a capacitor "bottom" electrode in the finished capacitor. In one embodiment, the substrate is an 18 µm thick electrodeposited, bare copper foil. Other foils of different thickness and metallurgy are also suitable.

In step 120, the dielectric is deposited (by sputtering or CSD) over the cleaned and polished side of the metallic foil substrate. One or more coats of the chemical solution may be deposited to achieve the desired thickness. The deposited solution may be dried between each coat at, a temperature of 250° C. for five to ten minutes, for example. The dried coat may also be heated at a temperature between 400° C. and 600° C. as a pre-anneal step to further remove organic content in the film and partially crystallize the dielectric.

In step 130, the coated substrate is annealed. High temperature annealing provides desirable physical and electrical properties. Annealing fully crystallizes and densifies the deposited dielectric layer, resulting in a dense microstructure. It promotes grain growth, with resultant grain sizes between 0.5 μm and 0.2 μm. A desirable electrical property resulting from the grain size is a capacitance density in excess of 0.5 μF/cm$^2$.

Annealing may be conducted in a high temperature, low oxygen partial pressure environment that prevents oxidation of the metallic foil. Suitable temperatures for annealing depend on the melting temperature of the underlying metallic foil. For example, if the underlying foil is copper, annealing may be performed between about 800° C. to 1050° C. If the underlying foil is nickel, annealing may be performed between approximately 800° C. and 1400° C. In this step, the low oxygen partial pressure may be achieved by use of high purity nitrogen. Other gas combinations are also possible.

In step 140, the dielectric may be optionally re-oxidized. The high firing temperature of step 130 may result in a dielectric with reduced oxygen in the lattice resulting in a high concentration of oxygen vacancies. This leads to high leakage and poor long-term reliability. Re-oxidation can replace the oxygen back into the lattice. It generally occurs at a lower temperature and at a higher oxygen content than in the annealing step. A suitable re-oxidation process is about 30 minutes at a temperature in the range between 400° C. and 600° C. in an atmosphere that has a partial pressure of oxygen in the range between $10^{-5}$ and $10^{-6}$ atmospheres. Other conditions may be suitable, depending on the resistance of the metallic foil to oxidation. For example, using nickel foil may permit a firing in air for 5 to 10 minutes at a temperature between 400° C. and 500° C. without severe oxidation of the foil. If the firing of step 130 is undertaken under less severe reducing conditions, or if the dielectric is doped with acceptor dopants designed to push the thermodynamic reduction of the dielectric to lower values of oxygen partial pressure, re-oxidation may be dispensed with.

In step 150, top thick electrodes are formed over the resulting dielectric. The top electrode may be deposited onto the dielectric by printing a thick-film conductor composition. In step 160, the thick-film composition may be fired at an elevated temperature, such as between about 500° C. and about 900° C. under a protective atmosphere to sinter the metallic particles together and yield the final electrode. The thick-film conductor composition can be formulated to print an electrode either of a minimum fired thickness of 1 micron or that fires out up to a thickness of 30 microns.

The firing process of step 160 may be combined with a dielectric re-oxidation process, if re-oxidation is necessary. For example, if the thick-film conductor composition is designed to fire at about 600° C., an atmosphere of approximately 1 part per million oxygen in nitrogen (partial pressure of oxygen of approximately $10^{-6}$ atmospheres) may be used to sinter the electrode and re-oxidize the dielectric simultaneously. These conditions will not cause significant oxidation of the underlying metallic foil. As an alternative, the thick-film conductor composition may be formulated to need curing only at low temperatures, such as between 100° C. and 200° C., to achieve electrode properties and form the patterned thick top electrode.

Figure 2A:
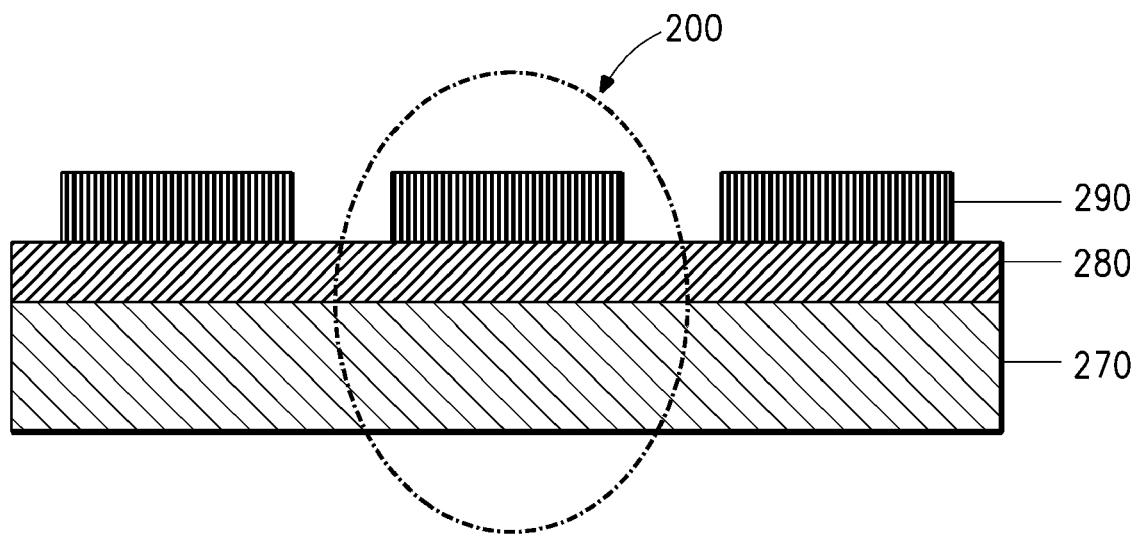
FIGS. 2A-B is an illustration of the resulting structure in a side elevation view (2A) and a top plan view (2B).

FIG. 2A shows in cross-section the structure resulting from the methods depicted in FIG. 1. Capacitor 200 comprises metallic foil 270, dielectric 280 and thick top electrode 290.

Figure 2B:
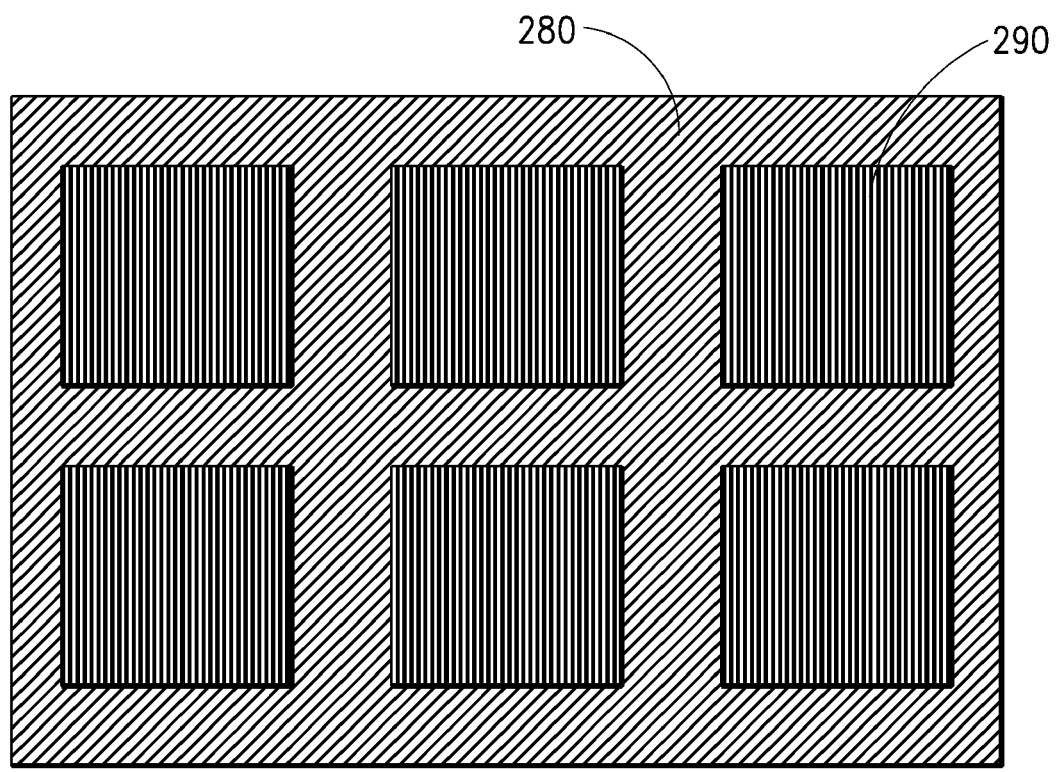
Figure 6:
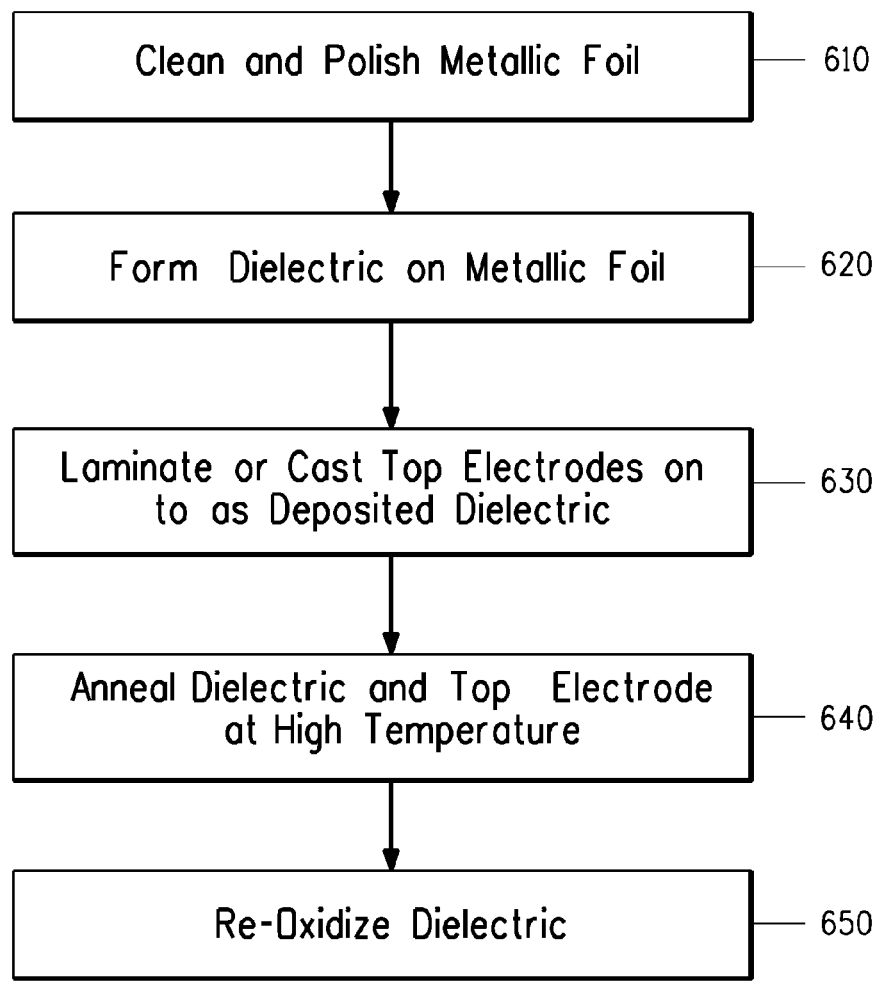
FIG. 6 is a block diagram illustrating a process for making a high capacitance density capacitor structure on metal foil wherein a continuous thick top electrode is formed either by laminating a metallic/polymer tape composition to an un-annealed dielectric or casting and drying a metallic/polymer/solvent slurry composition onto the dielectric and co-firing the resulting article.

FIG. 2B shows in plan view the resulting structure. In FIG. 2B, 6 capacitors are shown formed but any number of capacitors and any size may be formed by the methods described herein.

Figure 3:
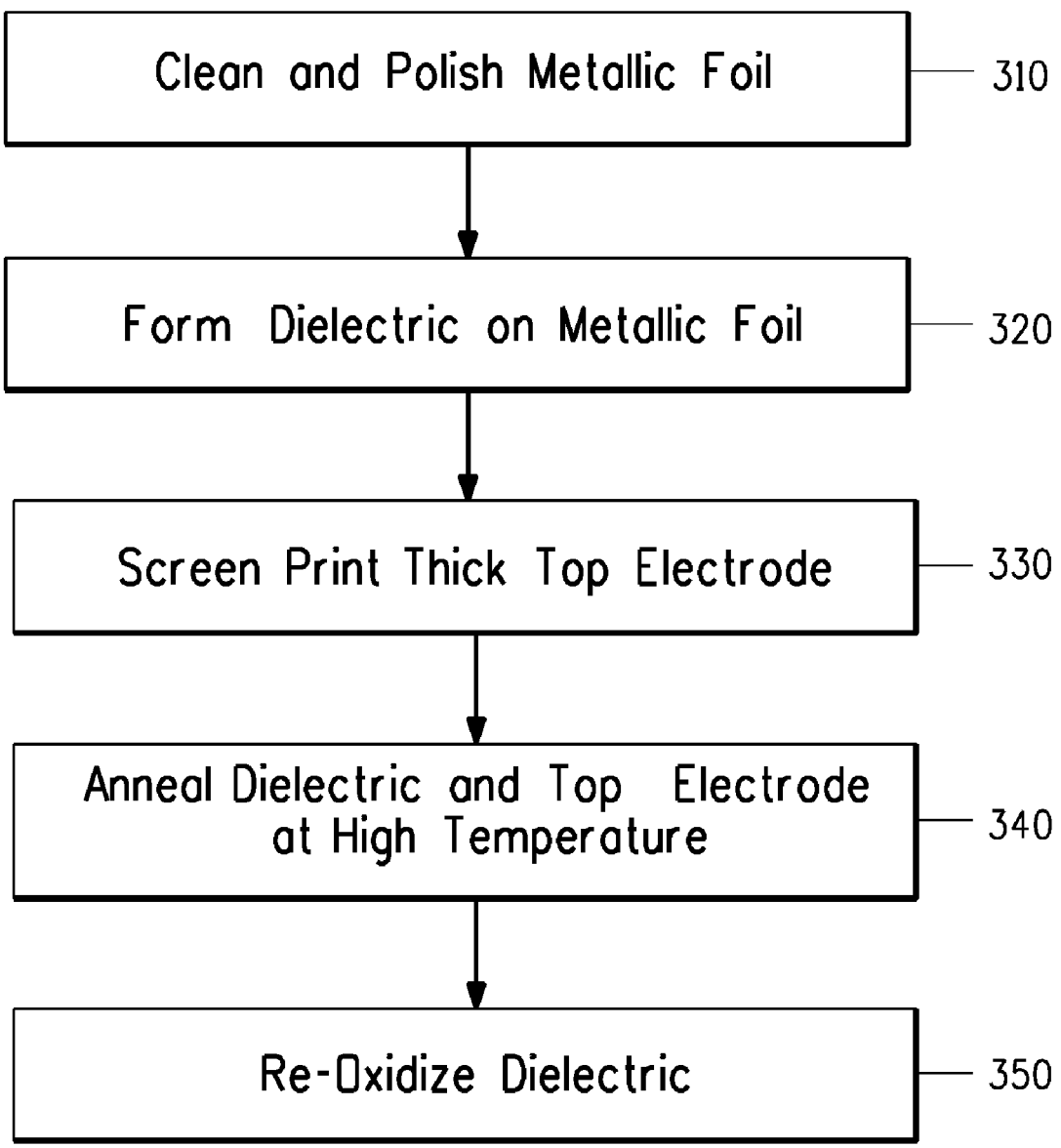
FIG. 3 is a block diagram illustrating a process for making high capacitance density capacitors on metal foil wherein the patterned thick-film top electrodes are formed by screen-printing a conductive paste on to un-annealed dielectric and the dielectric and top electrode are co-fired.

As an alternative to the methods depicted in FIG. 1, FIG. 3 shows that at step 330 the thick-film top electrode may be applied to the un-annealed dielectric. Steps 310 and 320 are essentially the same as steps 110 and 120. The dielectric and the top electrode may then be co-fired in step 340 followed by the dielectric re-oxidation step 350 to form the resulting structure shown in FIGS. 2A and 2B.

Figure 4:
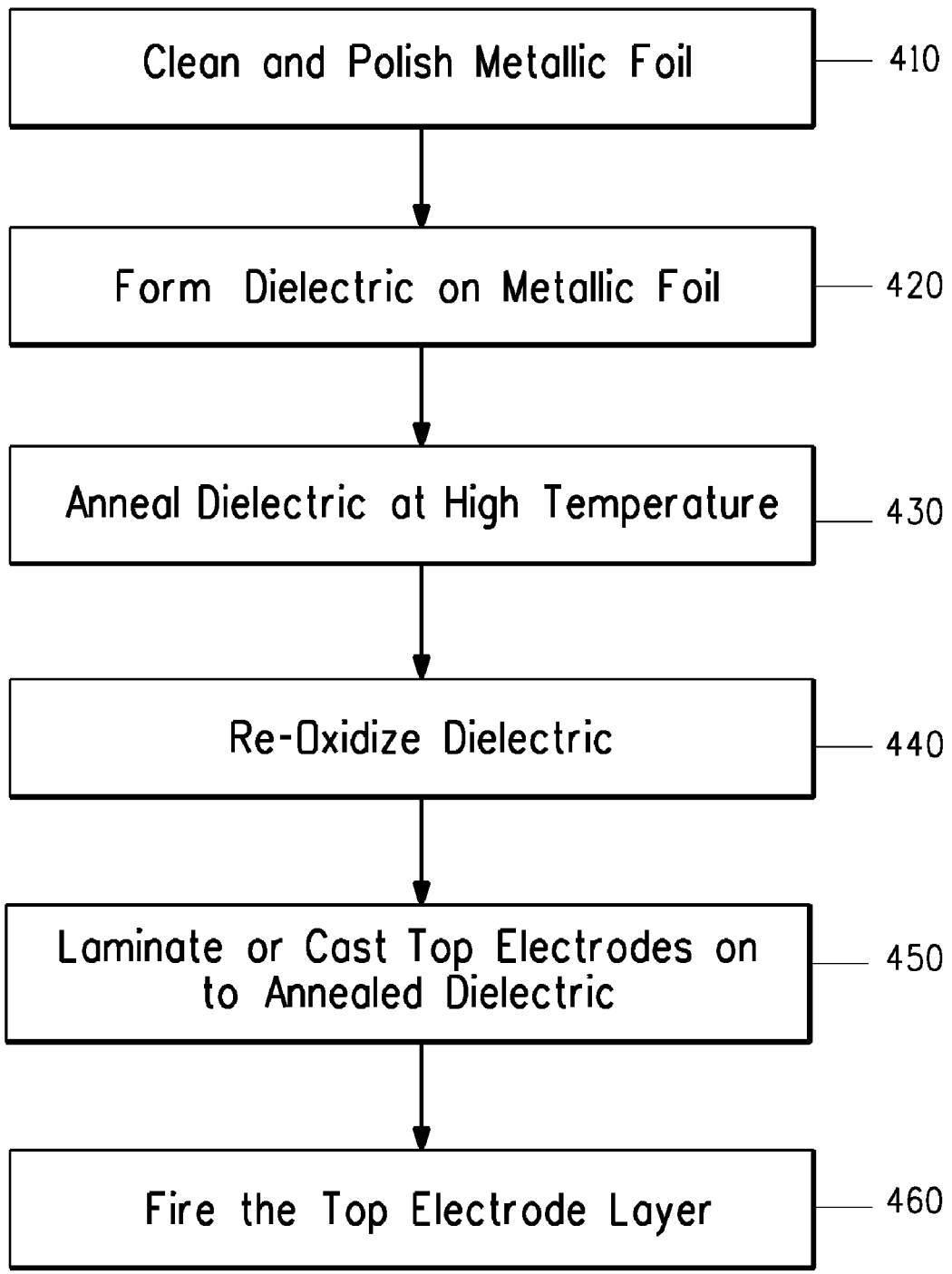
FIG. 4 is a block diagram illustrating a process for making a high capacitance density capacitor structure on metal foil wherein a continuous thick top electrode is formed either by laminating a metallic/polymer tape composition to an annealed (pre-fired) dielectric or casting and drying a metallic/polymer/solvent slurry composition on to an annealed dielectric and firing the resulting article.

FIG. 4 depicts a variation of the methods shown in FIG. 3. As with all methods described herein, and with similar materials and dimensions, in step 410, a metallic foil may be optionally cleaned and polished. In step 420, the dielectric is deposited via sputtering or CSD processes over the cleaned and polished side of the metallic foil substrate.

In step 430, the coated substrate is annealed in a similar fashion and similar results to those described for step 130. In step 440, the dielectric may be re-oxidized. In step 450, over the resulting dielectric, a top thick continuous electrode is formed either by laminating a metallic/polymer tape composition to the pre-annealed dielectric or casting and drying a metallic/polymer/solvent slurry composition onto the pre-annealed dielectric. In step 460, the continuous top electrode layer may be fired at an elevated temperature, such as between about 500° C. to about 900° C. under a protective atmosphere to sinter the metallic particles together and yield the final electrode. If firing is undertaken at a temperature and under an atmosphere that will re-oxidize the dielectric, step 440 may be dispensed with. The conductive tape or cast slurry is formulated to achieve a minimum final thickness of approximately 1 micron.

Figure 5:
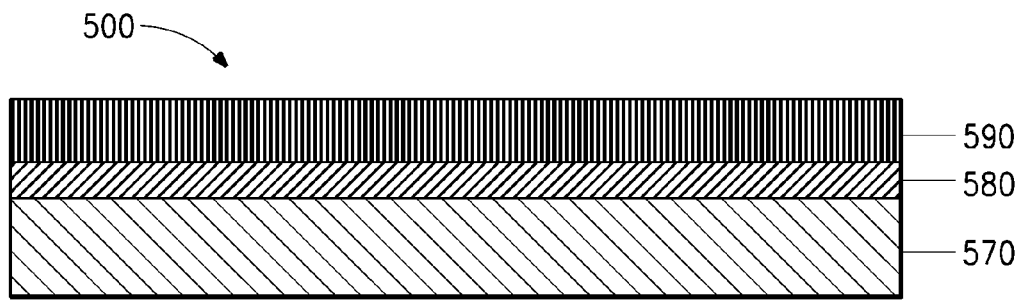
FIG. 5 is a side elevation view of the structure resulting from the methods of FIG. 4.

FIG. 5 shows in cross-section the resulting structure of the methods depicted in FIG. 4. Capacitor 500 comprises metallic foil 570, dielectric 580 and thick top electrode 590. As an alternative to the methods depicted in FIGS. 4 and 5, and as shown in FIG. 6, the top electrode may be applied at step 630 to the un-annealed dielectric. Steps 610 and 620 are essentially the same as steps 410 and 420. The dielectric and the top electrode may then be co-fired in step 640 followed by the dielectric re-oxidation step 650 to form the resulting structure shown in FIG. 5.

What is claimed is:

1. A method of forming a thick top electrode on a thin film dielectric formed on a metal foil comprising:
   providing a metal foil;
   forming a thin film dielectric on said metal foil;
   depositing a conductive paste or a conductive tape or a conductive slurry onto said thin film dielectric formed on said metal foil, thereby forming a thick top electrode, wherein the depositing includes screen printing when the paste is used, laminating when the tape is used and casting when the slurry is used;
   firing the conductive paste, conductive tape or conductive slurry and the dielectric at a temperature in the range between 500° C. and 900° C., thereby forming at least one thick top electrode directly on the thin film dielectric, wherein said thick top electrode has a thickness of from 1 to 30 microns, and wherein said metal foil, said thin film dielectric and said thick top electrode form a capacitor having a capacitance density of greater than 0.5 μF/cm$^2$; and further comprising: reoxidizing the dielectric in a reducing atmosphere having a partial pressure of oxygen from $10^{-5}$ to $10^{-6}$ atmospheres.

2. The method of claim 1, further comprising:
patterning the thick top electrode by screen printing, thereby forming individual electrodes.

3. The method of claim 1, wherein the depositing further comprises depositing the conductive paste, conductive tape or conductive slurry on an un-annealed dielectric;
co-firing the conductive paste, conductive tape or conductive slurry and the dielectric, whereby the dielectric is crystallized and the top electrode sintered.

4. The capacitor formed according to the method of claim 1.

5. The capacitor formed according to the method of claim 1.

6. The capacitor formed according to the method of claim 2.

7. The capacitor formed according to the method of claim 3.

8. The method of claim 1 wherein said thick top electrode comprises a plurality of individual electrodes formed directly on the thin film dielectric.

9. The method of claim 1 wherein the thin film dielectric is formed by a method selected from sputtering or chemical solution deposition.

10. The method of claim 1 wherein the thick top electrode is formed by screen printing a conductive paste on the thin film dielectric.

11. The method of claim 1 wherein the thick top electrode is formed by laminating a conductive tape on the thin film dielectric.

12. The method of claim 1 wherein the thick top electrode is formed by casting a conductive slurry on the thin film dielectric.

13. The method of claim 1 wherein forming the thin film dielectric on said metal foil includes depositing a thin film dielectric layer on said metal foil and annealing the thin film dielectric layer at a temperature in the range between 800° C. and 1400° C.

14. The method of claim 1 further comprising the step of cleaning and polishing a surface said metal foil, and wherein the thin film dielectric is formed on the cleaned and polished surface of said metal foil.

* * * * *